US010822702B2

United States Patent
Atthoff et al.

(10) Patent No.: US 10,822,702 B2
(45) Date of Patent: Nov. 3, 2020

(54) METALIZATION OF SURFACES

(71) Applicant: CUPTRONIC TECHNOLOGY LTD, Limassol (CY)

(72) Inventors: Björn Atthoff, Uppsala (SE); Sven Göthe, Bromma (SE)

(73) Assignee: CUPTRONIC TECHNOLOGY LTD., Limassol (CY)

( * ) Notice: Subject to any disclaimer, the term of this patent is extended or adjusted under 35 U.S.C. 154(b) by 0 days.

(21) Appl. No.: 15/336,836

(22) Filed: Oct. 28, 2016

(65) Prior Publication Data

US 2017/0044672 A1 Feb. 16, 2017

Related U.S. Application Data

(63) Continuation of application No. PCT/EP2015/059145, filed on Apr. 28, 2015.

(30) Foreign Application Priority Data

Apr. 28, 2014 (SE) ..................................... 1450501

(51) Int. Cl.
| | | |
|---|---|---|
| *C23C 18/18* | (2006.01) |
| *C23C 18/20* | (2006.01) |
| *C23C 18/16* | (2006.01) |
| *C23C 18/30* | (2006.01) |
| *B05D 1/28* | (2006.01) |
| *B05D 3/06* | (2006.01) |
| *C23C 18/40* | (2006.01) |
| *C25D 3/38* | (2006.01) |
| *C25D 5/10* | (2006.01) |
| *C25D 5/54* | (2006.01) |
| *H05K 3/38* | (2006.01) |
| *H05K 3/12* | (2006.01) |
| *H05K 3/18* | (2006.01) |

(52) U.S. Cl.
CPC ............ *C23C 18/1882* (2013.01); *B05D 1/28* (2013.01); *B05D 3/061* (2013.01); *C23C 18/1608* (2013.01); *C23C 18/1641* (2013.01); *C23C 18/1862* (2013.01); *C23C 18/204* (2013.01); *C23C 18/2006* (2013.01); *C23C 18/2033* (2013.01); *C23C 18/2066* (2013.01); *C23C 18/2086* (2013.01); *C23C 18/30* (2013.01); *C23C 18/40* (2013.01); *C25D 3/38* (2013.01); *C25D 5/10* (2013.01); *C25D 5/54* (2013.01); *H05K 3/1275* (2013.01); *H05K 3/182* (2013.01); *H05K 3/387* (2013.01)

(58) Field of Classification Search
CPC ............ C23C 18/1882; C23C 18/1608; C23C 18/1641; C23C 18/1862; C23C 18/2006; C23C 18/2033; C23C 18/204; C23C 18/2066; C23C 18/2086; C23C 18/30; C23C 18/40; B05D 1/28; B05D 3/061; C25D 3/38; C25D 5/10; C25D 5/54; H05K 3/1275; H05K 3/182; H05K 3/387
See application file for complete search history.

(56) References Cited

U.S. PATENT DOCUMENTS

| | | | |
|---|---|---|---|
| 5,685,898 A | 11/1997 | Dupuis | |
| 5,685,989 A | 11/1997 | Dupuis et al. | |
| 5,914,162 A * | 6/1999 | Bilkadi | ...................... C09J 7/28 |
| | | | 428/35.8 |
| 2011/0104454 A1 | 5/2011 | Kawano et al. | |
| 2014/0044884 A1* | 2/2014 | Berthelot | .................. C09D 4/00 |
| | | | 427/508 |

FOREIGN PATENT DOCUMENTS

| | | | |
|---|---|---|---|
| EP | 2 087 942 A1 | 8/2009 | |
| JP | H08-507576 A | 8/1996 | |
| JP | 2011-94192 A | 5/2011 | |
| WO | 2012/066018 A2 | 5/2012 | |
| WO | WO2012/066018 * | 5/2012 | ............. C23C 18/16 |

OTHER PUBLICATIONS

Pad Printing from Wikipedia, the free encyclopedia accessed at https://en.wikipedia.org/wiki/Pad_printing.*
Office Action dated Feb. 28, 2019 from corresponding Japanese Application No. 2016-565074, and English Translation.

* cited by examiner

*Primary Examiner* — Robert S Walters, Jr.
(74) *Attorney, Agent, or Firm* — Porter Wright Morris & Arthur LLP

(57) ABSTRACT

A method for application of a metal on a substrate comprises a) contacting at least a part of the surface of the substrate with at least one initiator, and polymerizable units with the ability to undergo a chemical reaction to form a polymer, the polymer comprising at least one charged group, wherein the contacting is achieved by contacting a pad with a plate comprising the at least one initiator and the polymerizable units and subsequently contacting the pad with the surface of the substrate, thereby transferring the at least one initiator and the polymerizable units to the surface of the substrate. Subsequently a metal layer is produced on the surface. The compactness of the applied metal layer is increased.

26 Claims, No Drawings

METALIZATION OF SURFACES

This application is a continuation of the International Application No. PCT/EP2015/059145 filed on 28 Apr. 2015, which claims priority to the Swedish Application No. SE-1450501-0 filed 28 Apr. 2014, the entire contents of which are hereby incorporated by reference.

TECHNICAL FIELD

The present invention relates generally to a method of applying a metal on a substrate surface by using a pad-printing process.

BACKGROUND

In the prior art many different methods of applying a metal on a substrate surface are described. Metallization of objects including polymeric objects are known from for instance WO 98/34446, WO 2007/116056, WO 2007/116057, and WO 2012/066018. One known method comprises covalent attachment of polymers to a surface with adsorption of for instance ions to charges on the polymers, where the ions are reduced to metal. Further metal can then be applied.

In the publications WO 98/34446, WO 2007/116056, WO 2007/116057, and WO 2012/066018 disclose various methods for metallization of a substrate involving polymers comprising carboxylic groups and adsorption of for instance ions. Although the methods disclosed in the above applications are used successfully there is room for an improvement at least for some applications. It is desirable to increase the compactness and density of the finished applied metal layer, at least for some applications.

Pad printing is a well-known technology described for instance in WO 2013/175492.

Although metallization of surfaces is accomplished today, it is desirable to further improve the application of the metal. In particular regarding the compactness of the metal layers and the high frequency properties of the metal layer.

It is desirable to be able to coat both 2-dimensional objects and 3-dimensional objects. Both with a covering layer of metal and also with a pattern of metal on the surface.

It is also desirable to decrease the processing time for the metallization process in an industrial scale.

In some cases where there are problems with the boundary between a coated part of a surface and an uncoated part of the surface. The boundary does not always become sharp enough.

In general it is also desirable to reduce the cost of a metallization process through shorter process time, effective use of copper in the process.

In particular it is desirable to improve the compactness of the finished applied metal layer. An improved compactness of the applied metal layer gives advantages such as an improved conductivity. It is further a problem how to improve the suitability of the metal layer for high frequency applications.

SUMMARY

It is an object of the present invention to obviate at least some of the problems in the prior art and provide an improved metallized substrate as well as an improved method of metallizing a substrate.

In a first aspect there is provided a method for application of a metal on a substrate, said method comprising the steps:

a) contacting at least a part of the surface of the substrate with at least one selected from:
  i) at least one initiator, and a polymerizable unit with the ability to undergo a chemical reaction to form a polymer, said polymer comprising at least one charged group, and
  ii) a polymer comprising at least one charged group, and
  wherein said contacting is achieved by contacting a pad with a plate comprising the at least one substance and subsequently contacting the pad with the surface of the substrate, thereby transferring the at least one substance to the surface of the substrate, (pad printing)
b) initiating a polymerisation reaction of polymerizable units if present, to obtain a polymer comprising at least one charged group,
c) depositing a second metal on an already applied first metal to obtain a metal coating,
wherein at least one of the following additions is made at least once at a point selected from: before step a), between steps a) and b), and between steps b) and c):
  i) addition of ions of at least one first metal and reducing said ions to metal, wherein a) said ions have the opposite sign of the charge compared to said at least one charged group on said polymer, or b) wherein said ions have the same sign of the charge compared to said at least one charged group on said polymer and wherein at least one chemical compound is added and at least partly adsorbed to the polymer comprising at least one charged group, said at least one chemical compound comprising at least one charge with a sign opposite compared to said ions,
  ii) addition of metal particles of at least one first metal, wherein said particles have a diameter in the range 1-1000 nm.

The pad printing and metallization processes use environmental friendly chemistry.

The invention uses new type chemistry in a pad printing process that has been designed to optimize the efficiency in a metallization process.

One advantage is that it becomes possible to coat 2D and 3D objects with metal, both in a pattern and with a fully covering layer.

The coating speed in an industrial scale can be improved.

Another advantage is that the thickness of the coating becomes very uniform and predictable.

No or a negligible amount of aerosol is created compared to for instance spray coating. The mixture is utilized economically with no or only little waste in an industrial scale.

It is possible to create a pattern or to coat the surface with a uniform layer of metal.

Yet another advantage is that the boundary between a metal coated part of the surface and an uncoated part of the surface becomes sharp.

In particular the compactness of the finished metal layer increases by using the combination of the pad-printing technology and the chemistry. The increased compactness of the metal layer, i.e. the increased density of the metal layer, gives improved properties regarding for instance the conductivity of the metal layer.

DETAILED DESCRIPTION

Before the invention is disclosed and described in detail, it is to be understood that this invention is not limited to particular compounds, configurations, method steps, substrates, and materials disclosed herein as such compounds, configurations, method steps, substrates, and materials may vary somewhat. It is also to be understood that the terminology employed herein is used for the purpose of describing particular embodiments only and is not intended to be limiting since the scope of the present invention is limited only by the appended claims and equivalents thereof.

It must be noted that, as used in this specification and the appended claims, the singular forms "a", "an" and "the" include plural referents unless the context clearly dictates otherwise.

If nothing else is defined, any terms and scientific terminology used herein are intended to have the meanings commonly understood by those of skill in the art to which this invention pertains.

"Actinic radiation" as used herein denotes electromagnetic radiation with the ability to cause a photochemical reaction. Examples include but are not limited to visible light, UV-light, IR-light all with the ability to cause a photochemical reaction.

"Polymerizable unit" as used herein denotes a chemical compound which is able to participate in a chemical reaction which yields a polymer. Both monomers and oligomers with the ability to form a polymer are encompassed.

The inventors have carried out intensive research and unexpectedly found that by combining a pad printing application technology with a chemistry involving charged groups and metal, the compactness of the finished metal layer increases. The use of a charged polymer to which ions and/or small metal particles is adsorbed is very suitable to combine with application with a pad because the compactness/density of the finished metal layer increases. The increased compactness is surprising, since the metal layer(s) which is applied after the first polymer become more compact. It is thus surprising that the compactness of the subsequently applied metal layer can be improved by using a particular technology when applying the compound(s) to the substrate, since the compound(s) are applied with a pad before the metal layer.

The mechanisms behind the increased compactness are not known. Without wishing to be bound by any scientific theories the inventors speculate that the structure of the polymer layer changes with the pad-application so that the compactness of the subsequently added metal layer is increased. It is known that a low $R_a$-value for the surface correlates with low losses in high frequency applications. The present invention gives low $R_a$-values, but there may also be additional factors contributing to the low losses in high frequency applications.

The increased compactness of the metal layer, i.e. the increased density of the metal layer gives improved properties regarding for instance the conductivity of the metal layer. Further the metal layer becomes more suitable in particular for high frequency applications.

In a first aspect there is provided a method for application of a metal on a substrate, said method comprising the steps:
  a) contacting at least a part of the surface of the substrate with at least one selected from:
    i) at least one initiator, and a polymerizable unit with the ability to undergo a chemical reaction to form a polymer, said polymer comprising at least one charged group, and
    ii) a polymer comprising at least one charged group, and
  wherein said contacting is achieved by contacting a pad with a plate comprising the at least one substance and subsequently contacting the pad with the surface of the substrate, thereby transferring the at least one substance to the surface of the substrate, (pad printing)
  b) initiating a polymerisation reaction of polymerizable units if present, to obtain a polymer comprising at least one charged group,
  c) depositing a second metal on an already applied first metal to obtain a metal coating,
  wherein at least one of the following additions is made at least once at a point selected from: before step a), between steps a) and b), and between steps b) and c):
    i) addition of ions of at least one first metal and reducing said ions to metal, wherein a) said ions have the opposite sign of the charge compared to said at least one charged group on said polymer, or b) wherein said ions have the same sign of the charge compared to said at least one charged group on said polymer and wherein at least one chemical compound is added and at least partly adsorbed to the polymer comprising at least one charged group, said at least one chemical compound comprising at least one charge with a sign opposite compared to said ions,
    ii) addition of metal particles of at least one first metal, wherein said particles have a diameter in the range 1-1000 nm.

A mixture is placed on the plate as in a known pad-printing technology. There are different ways to obtain the charged polymer onto which the first metal is adsorbed. The mixture can comprise several different substances. Different alternatives include:
  a) a polymerizable unit and an initiator, where the polymerizable unit can undergo a polymerization reaction to form a polymer comprising at least one charged group,
  b) a polymer which comprises at least one charged group,
  In both alternatives a solvent is optionally present.

If a polymerizable unit is utilized a suitable initiator is used together with the polymerizable unit. Polymerization is in one embodiment initiated with at least one selected from actinic radiation and heat.

As an alternative to polymerization or in combination with polymerization a polymer comprising at least one charged group is added.

In all cases the result is a polymer comprising at least one charged group. In many embodiments the resulting polymer comprises several charges per polymer chain.

The at least one substance to be contacted with the surface of the substrate is referred to as "the mixture" although there may be some embodiments where it is only one single polymerizable unit or one single polymer. The term "the mixture" is used since it is most often a mixture.

In one embodiment the mixture is placed in a desired pattern and in an alternative embodiment the entire plate is covered with the mixture. The pad, (printing pad) is pressed down on the plate and most of the mixture will adhere to the pad. The pad is moved to the substrate to be coated and pushed onto the substrate to be coated. The mixture will then be applied onto the substrate to be coated. The pad is then removed from the substrate surface to be coated. The process can then be repeated for the next substrate to be coated.

The pad printing technology gives the possibility to coat both 2D and 3D surfaces. For a 3D surface the printing pad is adapted to the shape of the substrate to be coated. Of course there are limitations regarding a 3D object, for instance it might be difficult or even impossible to coat the inside of a complex hollow 3D structure. More than one similar or different printing pads can be combined to coat one object.

In one embodiment the polymerizable units react with the initiator(s) and at least a part of the resulting polymer chains will be covalently bound to the surface by reaction with abstractable hydrogens and/or unsaturations on the substrate surface. When the initiator(s) are activated, radicals are formed on the surface of the substrate and they function as anchor points for the growing polymer chains so that a covalent bond is formed. At the same time in some cases cross linking reactions also take place so that the resulting polymers become cross linked. The polymer chains grow as the polymerization reaction propagates. At the same time in some embodiments the polymerization reaction occurs so that the polymer chains become branched. The branched and/or cross linked polymers give a higher mechanical strength so that the thin polymer layer is less prone to swell at interaction with water etc.

As an alternative to the polymerization reaction a polymer is added and in the latter case there is no reaction with atoms on the substrate surface. Thus the polymer does not become covalently bound to the surface in such an embodiment. This will most probably result in lower adhesion to the surface. However the adhesion is sufficient for many applications where the adhesion of the metal layer is not critical. For applications where a high adhesion to the substrate surface is critical, the embodiment comprising creation of covalently bound polymer chains is recommended.

On the polymers with the charged groups a first metal is adsorbed. This is made either by adsorption of oppositely charged metal ions or by adsorption of small metal particles (1-1000 nm). Alternatively charged compounds can be adsorbed to the polymers so that metal ions can be adsorbed to the oppositely charged compounds adsorbed to the polymers. Such a charged compound is called a conditioner and it gives the correct charge to the polymers. In case of metal ions they are reduced to metal. The addition of the first metal takes place before step a), between steps a) and b) or between steps b) and c). As an alternative the addition of the first metal takes place at several of these points. Both ions and metal particles can be added during the same process, either simultaneously or at different points. For instance when metal ions and/or metal particles are added before step a) it is conceived that the metal ions are still in the mixture and can act later in the method. The metal ions are reduced to metal by using methods known to a skilled person. It is understood that the particles adhere to the polymers due to attractive forces, including electrostatic forces.

When the first metal has been adsorbed on the polymers and reduced to metal (in case of ions) the second metal is subsequently applied on the surface. The application of the second metal is facilitated by the existing first metal. Optionally a third metal is applied on the second metal. Optionally one or more layers of metal are applied on top of the third metal.

In one embodiment the metal particles which may be added have diameters in the range 1-1000 nm, alternatively 2-500 nm, or alternatively 5-500 nm. Particles with an irregular shape are also encompassed. Embodiments with many different particles with different diameters are encompassed and the diameter of all particles should be within the range. A particle with an irregular shape may not have a well-defined diameter like a spherical particle. In case of a particle where the diameter is not directly and unambiguously possible to determine the diameter is defined as the largest dimension of the particle in any direction.

In one embodiment a further metal is applied to the existing metal on the surface of the substrate, said further metal can be the same as the mentioned second metal or a third metal. In one non limiting example palladium ions are deposited and reduced as the first metal, subsequently copper is deposited on the reduced palladium ions and silver is deposited on the copper.

The initiator, if present, is in one embodiment a mixture of a compound that can act as an initiator and an energy transfer compound which can transfer energy to the compound acting as initiator. Such mixtures are also called "initiator". Instead of using actinic radiation with a certain wavelength adapted to the compound that can act as an initiator one can add an energy transfer compound that absorbs the energy in the actinic radiation and transfers it to the compound that can act as an initiator. Both compound thus act together as an initiator.

It is understood that the substrate provided in step a) is not yet coated with metal. When the metal coating of the substrate is finished it is a metallized substrate. The substrate provided in step a) can also be referred to as the bare substrate, alternatively uncoated substrate, alternatively unmetallized substrate.

In one embodiment at least a part of the surface of the substrate comprises at least one selected from the group consisting of an abstractable hydrogen atom and an unsaturation. In an alternative embodiment the unmetallized substrate is treated so that its surface comprises at least one selected from the group consisting of an abstractable hydrogen atom and an unsaturation. In one embodiment such a surface treatment comprises covalent binding of at least one compound comprising at least one selected from an abstractable hydrogen and an unsaturation. In one embodiment such a surface treatment comprises adsorption of at least one compound comprising at least one selected from an abstractable hydrogen and an unsaturation. In one embodiment such a surface treatment is a combination of covalent binding and adsorption to the surface.

In one embodiment a polymerizable unit is present in step a) and the substrate comprises abstractable hydrogen atoms. In one embodiment a polymerizable unit is present in step a) and the substrate comprises unsaturated carbon bonds.

In one embodiment a polymer comprising at least one charged group is present and the substrate comprises charges of the opposite sign. During the pad printing action it is conceived that attractive forces are created between the charged polymer and charges on the surface.

By using the approach with surface modification to obtain a surface comprising at least one selected from an abstractable hydrogen and an unsaturation, it is possible to metallize materials where the bulk of the material does not comprise any abstractable hydrogens or unsaturations. Examples of such materials include but are not limited to glass, oxides, and ceramic materials including oxides of aluminum, beryllium, cerium, zirconium. Further examples of materials include but are not limited to carbides, borides, nitrides and cilicides.

In yet another embodiment there are neither abstractable hydrogen atoms nor any unsaturations. For such substrates it is possible to create a film of polymers without any polymerization reaction which attaches the polymer chains to the substrate surface.

In one embodiment the substrate comprises at least one polymer.

In one alternative the substrate is made of glass. In one embodiment the glass has been treated so that its surface at least partially comprises at least one selected from an abstractable hydrogen and an unsaturation.

The solvent is optional. In one embodiment the optional solvent is selected from the group consisting of methanol, ethanol, acetone, ethylene glycol, isopropyl alcohol, and ethyl acetate. In an alternative embodiment the optional solvent is selected from the group consisting of methanol, and ethanol.

In one embodiment with at least one initiator present the at least one initiator forms one phase together with the at least one polymerizable unit and the optional at least one solvent. This facilitates the application of the various compounds onto the substrate and the application can be performed in one step, which saves time and costs.

In one embodiment the polymerizable unit is a monomer. In an alternative embodiment the polymerizable unit is an oligomer. The polymerizable unit can undergo a chemical reaction and form a polymer. If the polymerizable unit is a monomer it can undergo a polymerization reaction to form a polymer. Oligomers are compounds formed by a polymerisation reaction of a few monomers. The oligomers can in turn undergo a reaction to form a polymer. In one embodiment the at least one polymerizable unit is at least one selected from a polymerizable monomer and a polymerizable oligomer.

In one embodiment the polymerizable unit is at least one organic acid.

In one embodiment the polymerizable unit is at least one selected from the group consisting of methacrylic acid, acrylic acid, and maleic acid. In one embodiment the polymerizable unit is at least one selected from the group consisting of methacrylic acid, ethyl acrylate, 2-hydroxyethyl acrylate and acrylic acid.

In one embodiment the polymerizable unit is at least one selected from the group consisting of methacrylic acid, and acrylic acid.

In one embodiment the polymer which is the result of polymerization of the polymerizable unit comprises at least one carboxylic group as the charged group.

In one embodiment the polymer comprises at least one carboxylic group.

In one embodiment the polymerization reaction is induced by actinic radiation. In one embodiment the polymerization reaction is induced by heat. In one embodiment the polymerization reaction is induced by actinic radiation and heat. In one embodiment heat is applied by at least one selected from IR-irradiation, application of hot air/hot gas, and bringing the substrate in contact with a heated surface.

In one embodiment where the polymerization reaction is induced by both actinic radiation and heat, the heat and actinic radiation are applied simultaneously. In one embodiment one source of both heat and actinic radiation is utilized to apply heat and actinic radiation simultaneously. One non limiting example is a lamp irradiating both IR-radiation and light. In an alternative embodiment the heat and actinic radiation are applied separate.

Initiators affected by both actinic radiation and heat are utilized in one embodiment. Examples of such initiators include but are not limited to alpha-hydroxyketone, phenylglycolate, acylphospine oxide, alpha aminoketones, benzildimethylketal, and oxime esters. Also peroxides and azo compounds are possible to use as initiators, activated primarily by heat and to some extent also by actinic radiation.

In one embodiment the initiators above are mixed with a further type of initiator.

In one embodiment the initiator is at least one selected from the group consisting of antraquinone, thioxanthone, isopropyl thioxanthone, xanthone, benzophenone, and fluorenone.

Examples of alpha-hydroxyketones include but are not limited to: 1-hydroxy-cyclohexyl-phenyl-ketone, 2-hydroxy-2-methyl-1-phenyl-1-propanone, 2-hydroxy-1-{4-[4-(2-hydroxy-2-methyl-propionyl)-benzyl]-phenyl}-2-methylpropan-1-one, and 2-hydroxy-1-[4-(2-hydroxyethoxy)phenyl]-2-methyl-1-propanone.

Examples of phenylglycolates include but are not limited to: oxy-phenyl-acetic acid 2-[2-oxo-2-phenyl-acetoxy-ethoxy]-ethyl ester, oxy-phenyl-acetic acid 2-[2-hydroxyethoxy]-ethyl ester, and phenyl glyoxylic acid methyl ester.

Examples of acylphosphine oxides include but are not limited to 2,4,6-trimethylbenzoyl-diphenylphosphine oxide, 2,4,6-trimethylbenzoyl-diphenyl phosphinate, and bis(2,4,6-trimethylbenzoyl)-phenylphosphineoxide.

Examples of alpha-aminoketones include but are not limited to 2-methyl-1 [4-(methylthio)phenylj-2-morpholinopropan-1-one, 2-benzyl-2-dimethylamino-1-(4-morpholinophenyl)-butanone-1, and 2-dimethylamino-2-(4-methylbenzyl)-1-(4-morpholin-4-yl-phenyl)-butan-1-one.

A non-limiting example of a benzildimethyl ketal is 2,2-dimethoxy-1,2-diphenylethan-1-one.

Examples of oxime esters include but are not limited to [1-(4-phenylsulfanylbenzoyl)heptylideneamino]benzoate, and [1-[9-ethyl-6-(2-methylbenzoyl)carbazol-3-yl]ethylideneamino] acetate.

Examples of peroxide include but are not limited to ketone peroxides, diacyl peroxides, dialkyl peroxides (dicumyl peroide), peroxyesters, peroxyketals, hydroperoxides, peroxydicarbonates and peroxymonocarbonates.

Examples of azo compounds include but are not limited to 2,2-azo di(isobutyronitrile) (AIBN)

The embodiment where the initiator is activated by both heat and actinic radiation simultaneously has a number of advantages. The adhesion is improved, since the initiation of the reaction is more efficient there will be a more efficient covalent bonding of the polymer to the substrate surface which in turn will give better adhesion. A more efficient initiation can also give more crosslinks in the polymers and/or more branched polymers which in turn also will give an improved adhesion. It has also turned out that lower concentrations of the first metal (for instance palladium) is required if an initiator with dual activation mechanism (heat and actinic radiation) is utilized.

In one particular embodiment an initiator is not added. Instead a polymer comprising charged groups is added. In such embodiments physical drying of polymers/oligomers is used. In other embodiments oxidative reaction of the polymers/oligomers is used to create a film, in such embodiments the polymers/oligomers comprise at least one functional group which can be oxidized in the presence of oxygen in air. In still further embodiments film coagulating polymers are utilized, one example is an acrylate based polymer. In all embodiments the polymer comprises at least one charged group.

In one embodiment the substrate is treated with at least one selected from plasma, corona, and flame treatment before step a). This treatment can improve the wettability of the surface.

In one embodiment the substrate is washed before step c).

In one embodiment the second metal is at least one selected from the group consisting of copper, silver, nickel, and gold. In one embodiment the first metal is palladium.

It is understood that also further layers of metal can be applied on the metal coated surface. Further layer(s) of metal can be applied using known techniques. It is well known how to apply further metal on an existing layer of metal.

In one embodiment at least one solvent is present in step a) and the at least one solvent is at least partially evaporated between step a) and step b). Thus an optional polymerization reaction in step b) can be carried out when the mixture on the surface is dried or if a part of the solvent has evaporated. This has the advantage that the viscosity increases so that the mixture more easily stays on the surface during activation of the initiator. Further it is possible to perform step a) and then wait a period of time before step b) is carried out. The substrate can be stored or transported before step b) is carried out in this embodiment.

The impact of oxygen in the process can be minimized through optimizing the thickness of the layer or use of protective gases. If an oxidative function on the polymer is used this has to be considered when using protective gases.

The wavelength of the UV source, laser or light used for irradiation should match the absorption of spectra of the initiator, if such an initiator is used. A preferred embodiment is initiators activated by both actinic radiation and heat.

In one embodiment the polymerization reaction is induced by irradiation with a UV light source that matches the wavelength sensitivity of the photo initiator.

The polymerizable unit is in one embodiment selected from various polymerizable units having a carboxyl functional group. Thus the polymerizable unit will become a carboxyl group as a charged group.

In one embodiment the second metal is at least one selected from the group consisting of copper, silver, and gold. In one embodiment the first metal is palladium.

In one embodiment the substrate is after step b) subjected to drying and optionally oxidation. In one embodiment the optional oxidation is in air. When a polymer is either made of polymerizable units or adsorbed to the substrate surface the substrate can be dried. Optionally it can be oxidised for instance in ambient air.

In a second aspect there is provided a metallized substrate manufactured according to the method described above.

In a third aspect there is provided a kit comprising at least one polymerizable unit, at least one initiator, and optionally at least one solvent and an instruction to perform the method as described above.

In one embodiment of the kit the at least one polymerizable unit, the at least one initiator, and the optional at least one solvent are in a mixture.

In one embodiment of the kit a solvent is present and the solvent is at least one selected from the group consisting of methanol, ethanol, acetone, ethylene glycol, isopropyl alcohol, and ethyl acetate.

In one embodiment of the kit a solvent is present and the solvent is at least one selected from the group consisting of methanol, and ethanol.

In one embodiment of the kit the monomer is at least one organic acid.

In one embodiment of the kit the monomer is at least one selected from the group consisting of methacrylic acid, acrylic acid, and maleic acid.

In one embodiment of the kit the monomer is at least one selected from the group consisting of methacrylic acid, ethyl acrylate, 2-hydroxyethyl acrylate and acrylic acid.

In one embodiment of the kit the initiator is at least one selected from the group consisting of antraquinone, thioxanthone, isopropyl thioxanthone, xanthone, benzophenone, and fluorenone.

In one embodiment of the kit the initiator is at least one selected from the group consisting of alpha-hydroxyketone, phenylglycolate, acylphospine oxide, alpha aminoketones, benzildimethylketal, and oxime esters.

In one embodiment of the kit the initiator is at least one selected from the group consisting of peroxides, and azo compounds.

Other features and uses of the invention and their associated advantages will be evident to a person skilled in the art upon reading the description and the examples.

It is to be understood that this invention is not limited to the particular embodiments shown here. The following examples are provided for illustrative purposes and are not intended to limit the scope of the invention since the scope of the present invention is limited only by the appended claims and equivalents.

EXAMPLES

Example 1

A monomer mixture between methacrylic acid (40%) and TMPTMA (trimethylol trimethacrylate) (60%) was blended with 3.5% Isopropyl thioxanthone and 1% 2,2-dimethoxy-1,2-diphenylethan-1-one. This mixture was then diluted with ethanol (mixture:ethanol, 9:1) to obtain the best reological properties for the Pad printing process.

A Pad printing machine SPE MS-2 was used to test the performance of the Pad printing laquer. A pattern with 20 µm lines and a rectangular surface of 30 mm×10 mm was printed on a PA6 (Polyamid 6) panel. The thickness of the layer was approximately 6 µm.

After the printing process was the panel moved to UV radiation source, Fusion P300, and exposed to UV light (370 mJ/cm$^2$). The belt speed was 8 m/min. The printed pattern is polymerized and anchored with covalent bonds to the surface PA6 panel.

After irradiation was the panel washed in deionized water (DIW). In the next step was the panel activated in a commercial solution containing palladium(II) ions. The palladium ions were reduced to palladium metal by dipping the panel in a commercial reducing media. The panel was then washed in DIW before placing it in a commercial chemical copper bath for copper plating.

The result on the panel was straight lines of copper with a line width between 19 µm and 21 µm and the rectangular surface was fully covered with copper. The copper lines and rectangular surface has a film thickness of 8 to 10 µm.

The adhesion was measured on the rectangular surface with an adhesion of >14 N/cm. This adhesion value was more than 2 times higher than comparable commercial systems. The copper layer can perform as a high conducting layer. Comparable conducting commercial Pad printing systems have 10 to 100 times lower conductivity.

Example 2

An oligomer containing carboxylic acid functionality was synthesized to a molecular weight of in average 1200. The building blocks were hexandiol and acrylic acid. The acrylic acid was in excess to get a carboxylic acid endgroups and functionality of the oligomer (oligomer A).

A mixture between hexandiol diacrylate (25%) and Oligomer A (75%) was blended with 3.0% Fluorenone and 1.5% 2,2-dimethoxy-1,2-diphenylethan-1-one. This mixture had adequate reological properties for the Pad printing process.

A Pad printing machine SPE MS-2 was used to test the performance of the Pad printing laquer. A pattern with 20 µm lines and a rectangular surface of 30 mm×10 mm were printed on a PA6 (Polyamid 6) panels. The thickness of the Pad printing layer was approximately 5 µm.

After the printing process were the panels moved to UV radiation source, Fusion P300, and exposed to UV light. The belt speed was 12 m/min (325 mJ/cm$^2$). The printed pattern on the panels was polymerized and anchored with covalent bonds to the surface PA6 panels.

After irradiation were the panels washed in deionized water (DIW). In the next step was the panels activated in a commercial solution containing palladium(II) ions. The palladium ions were reduced to palladium metal by dipping the panels in a commercial reducing media. The panels were then washed in DIW before placing it in a commercial chemical copper bath for copper plating.

The result on the panels was straight lines of copper with a line width between 19 µm and 21 µm and the rectangular surface was fully covered with copper. The copper lines and rectangular surface had a film thickness of 8 to 10 µm.

The adhesion was measured on the rectangular surface with an adhesion of >11 N/cm. This adhesion value was almost 2 times higher than comparable commercial systems. The copper layer can perform as a high conducting layer. Comparable conducting commercial Pad printing systems have 10 to 100 times lower conductivity.

Example 3

A monomer mixture between acrylic acid (35%), HDDA (hexane diol diacrylate) (20%) and TMPTA (trimethylol triacrylate) (45%) was blended with 2.5% dicumyl peroide. This mixture was then diluted with methanol (mixture:methanol, 4:1) to obtain the best reological properties for the Pad printing process.

A Pad printing machine SPE MS-2 was used to test the performance of the Pad printing mixture. A pattern with 20 µm lines and a rectangular surface of 30 mm×10 mm was printed on Makrolon (Polycarbonate) panels. The thickness of the layer on Makrolon panels was approximately 5 µm.

After the printing process were the panels moved to an oven with induction heating. The oven had a temperature of 65° C. The panels were kept in the oven for 30 minutes. The printed pattern was polymerized and anchored with covalent bonds to the surface Makrolon panels.

After irradiation were the panels washed in deionized water (DIW). In the next step was the panels activated in a commercial solution containing palladium(II) ions. The palladium ions were reduced to palladium metal by dipping the panel in a commercial reducing media. The panels were then washed in DIW before placing them in a commercial chemical copper bath for copper plating.

The result on the panel was straight lines of copper with a line width around 20 µm and the rectangular surface was fully covered with copper. The copper lines and rectangular surface has a film thickness of 10 to 12 µm.

The adhesion was measured on the rectangular surface with an adhesion of >15 N/cm. This adhesion value was more than 2 times higher than comparable commercial systems. The copper layer can perform as an antenna. There are today no antennas made from a Pad printing process. This is the first example of antennas made with a Pad printing process.

Example 4

An acrylic emulsion with carboxylic acid functionality was used in a Pad printing process for metallization.

This acrylic emulsion had adequate reological properties for the Pad printing process.

The Pad printing machine SPE MS-2 was used to test the performance of the Pad printing emulsion. A pattern with 20 µm lines and a rectangular surface of 30 mm×10 mm were printed on PC/ABS panels. The thickness of the Pad printing layer was approximately 7 µm.

After the Pad printing process were the panels moved to a room with 25° C. and RH of 75%. The drying time was 8 hours. The printed pattern was physical dried on the surface of the PC/ABS panels.

After irradiation were the panels washed in deionized water (DIW). In the next step was the panels activated in a commercial solution containing palladium(II) ions. The palladium ions were reduced to palladium metal by dipping the panels in a commercial reducing media. The panels were then washed in DIW before placing it in a commercial chemical copper bath for copper plating.

The result on the panels was straight lines of copper with a line width between 19 µm and 21 µm and the rectangular surface was fully covered with copper. The copper lines and rectangular surface had a film thickness of 12 to 14 µm.

The adhesion was measured on the rectangular surface with an adhesion of >6 N/cm. The copper layer can perform as a high conducting layer. Comparable conducting commercial Pad printing systems have 10 to 100 times lower conductivity.

Example 5

An oligomer containing carboxylic acid functionality was synthesized to a molecular weight of in average 900. The building blocks were diethylene diol and acrylic acid. The acrylic acid was in excess to get carboxylic acid endgroups and functionality of the oligomer. The oligomer also contains double bonds in the structure. The oligomer was named oligomer A.

A mixture between an air drying alkyd (40%) and Oligomer A (60%) was blended with isopropyl alcohol (IPA) in the ratio 65% mixture and 35% IPA. This mixture had good reological properties for the Pad printing process.

A Pad printing machine SPE MS-2 was used to test the performance of the Pad printing laquer. A pattern with 20 µm lines and a rectangular surface of 30 mm×10 mm were printed on PA6 (Polyamid 6) panels. The thickness of the Pad printing layer was approximately 5 µm.

After the Pad printing process were the panels moved to a room with 25° C. and RH of 75%. The drying time was 24 hours. The printed pattern on the PC/ABS panels was dried by an oxidative mechanism (polymerization).

After irradiation were the panels washed in deionized water (DIW). In the next step was the panels activated in a commercial solution containing palladium(II) ions. The palladium ions were reduced to palladium metal by dipping the panels in a commercial reducing media. The panels were then washed in DIW before placing it in a commercial chemical copper bath for copper plating.

The result on the panels was straight lines of copper with a line width between 19 µm and 21 µm and the rectangular surface was fully covered with copper. The copper lines and rectangular surface had a film thickness of 8 to 10 µm.

The adhesion was measured on the rectangular surface with an adhesion of >11 N/cm. This adhesion value was almost 2 times higher than comparable commercial systems. The copper layer can perform as a high conducting layer.

Comparable conducting commercial Pad printing systems have 10 to 100 times lower conductivity.

Example 6

A polyester resin with carboxylic acid functionality and acrylic monomer, ratio 2:1, with 2.5 weight-% 2,2-Dimethoxy-1,2-diphenylethan-1-one and 1.3 weight-% Bensophenone in ethanol was used in a Pad printing process for metallization.

This solution had adequate reological properties for the Pad printing process.

The Pad printing machine SPE MS-2 was used to test the performance of the Pad printing system. A pattern with 10 μm lines, space between lines were 20 μm and a rectangular surface of 30 mm×10 mm were printed on PA panels. The thickness of the Pad printing layer was approximately 5 μm.

After the Pad printing process were the panels transferred to a UV-curing unit, Fusion F300S. The line speed was 5 m/min and the printed pattern on the surface of the PA panels was dry after 1 pass through the UV-curing unit.

After irradiation were the panels washed in deionized water (DIW). In the next step was the panels activated in a commercial solution containing palladium(II) ions. After this step were the palladium ions reduced to palladium metal by dipping the panels in a commercial reducing media. The panels were then washed in DIW before placing it in a commercial chemical copper bath for copper plating.

The result on the panels was straight lines of copper with a line width between 10 μm and 12 μm and spacing were 19 μm. The rectangular surface was fully covered with copper. The copper lines and rectangular surface had a film thickness of approximately 6 μm.

The adhesion was measured on the rectangular surface with an adhesion of >15 N/cm. The copper has an electrical conductivity (at 20° C.), $\sigma=5.3\times10^7$ S/m. Comparable conducting commercial Pad printing systems have >10 times lower conductivity.

Example 7

An oligomer containing carboxylic acid functionality was synthesized to a molecular weight of in average 900. The building blocks were diethylene diol, maleic acid and acrylic acid. The organic acid content was in excess to get carboxylic acid end groups and functionality of the oligomer. The oligomer also contains double bonds in the structure. The oligomer was named oligomer A.

A mixture between an air drying alkyd (40%) and Oligomer A (60%) was blended with isopropyl alcohol (IPA) in the ratio 65% mixture and 35% IPA. 2 weight-% 1-hydroxycyclohexyl-phenyl-1.one. This mixture had good reological properties for the Pad printing process.

A Pad printing machine SPE MS-2 was used to test the performance of the Pad printing laquer. A pattern with 20 μm lines and a rectangular surface of 30 mm×10 mm were printed on PC/ABS panels. The thickness of the Pad printing layer was approximately 5 μm.

After the Pad printing process were the panels moved to a room with 25° C. and RH of 75%. The drying time was 12 hours followed by UV-curing in a Fusion F300S unit. The line speed was 5 m/min. The printed pattern on the PC/ABS panels was dried by an oxidative mechanism (polymerization) and a radical mechanism.

After irradiation were the panels washed in deionized water (DIW). In the next step was the panels activated in a commercial solution containing palladium(II) ions. The palladium ions were reduced to palladium metal by dipping the panels in a commercial reducing media. The panels were then washed in DIW before placing it in a commercial chemical copper bath for copper plating.

The result on the panels was straight lines of copper with a line width between 20 μm and 23 μm and the rectangular surface was fully covered with copper. The copper lines and rectangular surface had a film thickness of 8 to 10 μm.

The adhesion was measured on the rectangular surface with an adhesion of >11 N/cm. This adhesion value was almost 2 times higher than comparable commercial systems. The copper layer can perform as a high conducting layer. Comparable conducting commercial Pad printing systems have >10 times lower conductivity.

Example 8

A polyester resin with carboxylic acid functionality and acrylic monomer, ratio 2:1, with 2.5 weight-% 2,2-Dimethoxy-1,2-diphenylethan-1-one and 1.3 weight-% Bensophenone in ethanol was used in a Pad printing process for metallization.

This solution had adequate reological properties for the Pad printing process.

The Pad printing machine SPE MS-2 was used to test the performance of the Pad printing system. A pattern with 10 μm lines, space between lines were 20 μm and a rectangular surface of 30 mm×10 mm were printed on COC polymer (Cyclo olefinic copolymers) panels with surface roughness $<R_a$ 0.2 μm. The thickness of the Pad printing layer was approximately 6 μm.

After the Pad printing process were the panels transferred to a UV-curing unit, Fusion F300S. The line speed was 5 m/min and the printed pattern on the surface of the COC panels was dry after 1 pass through the UV-curing unit.

After irradiation were the panels washed in deionized water (DIW). In the next step was the panels activated in a commercial solution containing palladium(II) ions. After this step were the palladium ions reduced to palladium metal by dipping the panels in a commercial reducing media. The panels were then washed in DIW before placing it in a commercial chemical copper bath for copper plating.

The result on the panels was straight lines of copper with a line width between 9 μm and 11 μm and spacing were 21 μm. The rectangular surface was fully covered with copper. The copper lines and rectangular surface had a film thickness of approximately 6 μm.

The adhesion was measured on the rectangular surface with an adhesion of >9 N/cm. The copper has an electrical conductivity (at 20° C.), $\sigma=5.3\times10^7$ S/m. Comparable conducting commercial Pad printing systems have >10 times lower conductivity. Since the surface has a very low $R_a$-value it has very low losses in high frequency applications.

The combination low losses in high frequency, high conductivity, thin line resolution and high adhesion is unique.

Example 9

A polyester resin with carboxylic acid functionality and acrylic monomer, ratio 2:1, with 2.5 weight-% 2,2-Dimethoxy-1,2-diphenylethan-1-one and 1.3 weight-% Bensophenone in ethanol (30 weight-%) was used in a Pad printing process for metallization.

This solution had adequate reological properties for the Pad printing process.

The Pad printing machine SPE MS-2 was used to test the performance of the Pad printing system. A pattern with 20 µm lines, space between lines were 20 µm and a rectangular surface of 30 mm×10 mm were printed on COC polymer (Cyclo olefinic copolymers) panels with surface roughness <$R_a$0.2 µm. The thickness of the Pad printing layer was approximately 10 µm.

After the Pad printing process were the panels transferred to a UV-curing unit, Fusion F300S. The line speed was 5 m/min and the printed pattern on the surface of the COC panels was dry after 1 pass through the UV-curing unit.

After irradiation were the panels washed in deionized water (DIW). In the next step was the panels activated in a J-Kem International's commercial System S, a 3-METAL ALLOY DIRECT PLATING PROCESS. SYSTEM-S is the only Direct Plating Process that due to the innovative 3-metal alloy can deliver conductivity in level with Electroless copper and this process substitute activation, reduction with palladium and Electroless copper. The panels were then washed in DIW before placing it in a commercial electroplating copper bath for copper plating.

The result on the panels was straight lines of copper with a line width between 20 µm and 23 µm and spacing were 21 µm. The rectangular surface was fully covered with copper. The copper lines and rectangular surface had a film thickness of approximately 12 µm of copper.

The adhesion was measured on the rectangular surface with an adhesion of >9 N/cm. The copper has an electrical conductivity (at 20° C.), $\sigma=5.8\times10^7$ S/m. Comparable conducting commercial Pad printing systems have >10 times lower conductivity. Since the surface has a very low $R_a$-value it has very low losses in high frequency applications.

The combination low losses in high frequency, high conductivity, thin line resolution and high adhesion is unique.

We claim:

1. A method for application of a metal conductor on a substrate, wherein the substrate surface comprises abstractable hydrogens and/or unsaturations, said method comprising the steps of:
   a) contacting at least a part of the surface of the substrate with
   at least one initiator, and polymerizable units with the ability to undergo a chemical reaction to form a polymer, said polymer comprising at least one charged group, wherein said contacting is achieved by contacting a pad with a plate comprising the at least one initiator and the polymerizable units and subsequently contacting the pad with the surface of the substrate, thereby transferring the at least one initiator and the polymerizable units to the surface of the substrate,
   b) initiating a polymerisation reaction of the polymerizable units to obtain the polymer comprising at least one charged group, so that the resulting polymer will be covalently bound to the surface by reaction with abstractable hydrogens and/or unsaturations on the substrate surface, and
   c) depositing a second metal on an already applied at least one first metal to obtain a conductive metal coating,
   wherein at least one of the following additions is made at least once at a point selected from: before step a), between steps a) and b), and between steps b) and c):
   i) addition of ions of the at least one first metal and reducing said ions to metal, wherein a) said ions have the opposite sign of the charge compared to said at least one charged group on said polymer, or b) wherein said ions have the same sign of the charge compared to said at least one charged group on said polymer and wherein at least one chemical compound is added and at least partly adsorbed to the polymer comprising at least one charged group, said at least one chemical compound comprising at least one charge with a sign opposite compared to said ions, and
   ii) addition of metal particles of the at least one first metal, wherein said particles have a diameter in the range 1-1000 nm.

2. The method according to claim 1, wherein at least one solvent is added in step a).

3. The method according to claim 1, wherein further metal is applied to the second metal on the surface of the substrate, said further metal is selected from the group consisting of the said second metal and a third metal.

4. The method according to claim 1, wherein the substrate comprises at least one polymer.

5. The method according to claim 1, wherein polymerization of the polymerizable units is induced by exposure to at least one selected from the group consisting of heat and actinic radiation adapted to said at least one initiator.

6. The method according to claim 1, wherein polymerization of the polymerizable units is induced by heat and UV-light adapted to said at least one initiator.

7. The method according to claim 1, wherein a solvent is present in step a) and the solvent is at least one selected from the group consisting of methanol, ethanol, acetone, ethylene glycol, isopropyl alcohol, and ethyl acetate.

8. The method according to claim 1, wherein a solvent is present in step a) and the solvent is at least one selected from the group consisting of methanol, and ethanol.

9. The method according to claim 1, wherein the polymerizable units are at least one organic acid.

10. The method according to claim 1, wherein the polymerizable units are at least one selected from the group consisting of methacrylic acid, acrylic acid, and maleic acid.

11. The method according to claim 1, wherein the polymerizable units are at least one selected from the group consisting of methacrylic acid, ethyl acrylate, 2-hydroxyethyl acrylate and acrylic acid.

12. The method according to claim 1, wherein the initiator is at least one selected from the group consisting of anthraquinone, thioxanthone, isopropyl thioxanthone, xanthone, benzophenone, and fluorenone.

13. The method according to claim 1, wherein the initiator is at least one selected from the group consisting of alpha-hydroxyketone, phenylglycolate, acylphospine oxide, alpha aminoketones, benzildimethylketal, and oxime esters.

14. The method according to claim 1, wherein the initiator is at least one selected from the group consisting of peroxides, and azo compounds.

15. The method according to claim 1, wherein the substrate is treated with at least one selected from the groups consisting of plasma, corona, and flame treatment before step a).

16. The method according to claim 1, wherein the substrate is washed before step c).

17. The method according to claim 1, wherein the at least one first metal is palladium.

18. The method according to claim 1, wherein the second metal is at least one selected from the group consisting of copper, silver, nickel and gold.

19. The method according to claim 1, wherein at least one solvent is present in step a) and wherein said at least one solvent is at least partially evaporated between step a) and step b).

20. The method according to claim 1, wherein the at least one polymerizable units are at least one selected from a polymerizable monomer and a polymerizable oligomer.

21. The method according to claim 1, wherein the substrate comprises abstractable hydrogen atoms.

22. The method according to claim 1, wherein the substrate comprises unsaturated carbon bonds.

23. The method according to claim 1, wherein the polymer comprising at least one charged group is present and the substrate comprises charges of the opposite sign.

24. The method according to claim 1, wherein the substrate after step b) is subjected to drying and optionally oxidation.

25. A method for application of a metal conductor on a substrate, wherein the substrate surface comprises abstractable hydrogens and/or unsaturations, said method comprising the steps of:
   a) contacting at least a part of the surface of the substrate with
      at least one initiator, and polymerizable units selected from methacrylic acid, acrylic acid, maleic acid, ethyl acrylate, and 2-hydroxyethyl acrylate, with the ability to undergo a chemical reaction to form a polymer comprising at least one charged group, wherein said contacting is achieved by contacting a pad with a plate comprising the at least one initiator and the polymerizable units and subsequently contacting the pad with the surface of the substrate, thereby transferring the at least one initiator and the polymerizable units to the surface of the substrate,
   b) initiating a polymerisation reaction of the polymerizable units to obtain the polymer comprising at least one charged group, so that the resulting polymer will be covalently bound to the surface by reaction with abstractable hydrogens and/or unsaturations on the substrate surface, and
   c) depositing a second metal selected from copper, silver, nickel and gold on an already applied at least one first metal comprising palladium to obtain a conductive metal coating,
   wherein at least one of the following additions is made at least once at a point selected from: before step a), between steps a) and b), and between steps b) and c):
   i) addition of ions of the at least one first metal and reducing said ions to metal, wherein a) said ions have the opposite sign of the charge compared to said at least one charged group on said polymer, or b) wherein said ions have the same sign of the charge compared to said at least one charged group on said polymer and wherein at least one chemical compound is added and at least partly adsorbed to the polymer comprising at least one charged group, said at least one chemical compound comprising at least one charge with a sign opposite compared to said ions, and
   ii) addition of metal particles of the at least one first metal, wherein said particles have a diameter in the range 1-1000 nm.

26. A method for application of a metal conductor on a substrate, wherein the substrate surface comprises abstractable hydrogens and/or unsaturations, said method comprising the steps of:
   a) contacting at least a part of the surface of the substrate with
      at least one initiator, and polymerizable units with the ability to undergo a chemical reaction to form a polymer, said polymer comprising at least one charged group, said initiator comprising at least one selected from the group consisting of anthraquinone, thioxanthone, isopropyl thioxanthone, xanthone, benzophenone, fluorenone, alpha-hydroxyketones, phenylglycolates, acylphospine oxides, alpha-aminoketones, benzildimethylketal, oxime esters, peroxides, and 2,2-azo di(isobutyronitrile), wherein said contacting is achieved by contacting a pad with a plate comprising the at least one initiator and the polymerizable units and subsequently contacting the pad with the surface of the substrate, thereby transferring the at least one initiator and the polymerizable units to the surface of the substrate,
   b) initiating a polymerisation reaction of the polymerizable units to obtain the polymer comprising at least one charged group, so that the resulting polymer will be covalently bound to the surface by reaction with abstractable hydrogens and/or unsaturations on the substrate surface, and
   c) depositing a second metal on an already applied at least one first metal to obtain a conductive metal coating,
   wherein at least one of the following additions is made at least once at a point selected from: before step a), between steps a) and b), and between steps b) and c):
   i) addition of ions of the at least one first metal and reducing said ions to metal, wherein a) said ions have the opposite sign of the charge compared to said at least one charged group on said polymer, or b) wherein said ions have the same sign of the charge compared to said at least one charged group on said polymer and wherein at least one chemical compound is added and at least partly adsorbed to the polymer comprising at least one charged group, said at least one chemical compound comprising at least one charge with a sign opposite compared to said ions, and
   ii) addition of metal particles of the at least one first metal, wherein said particles have a diameter in the range 1-1000 nm.

* * * * *

UNITED STATES PATENT AND TRADEMARK OFFICE
CERTIFICATE OF CORRECTION

Page 1 of 1

PATENT NO. : 10,822,702 B2
APPLICATION NO. : 15/336836
DATED : November 3, 2020
INVENTOR(S) : Björn Atthoff et al.

It is certified that error appears in the above-identified patent and that said Letters Patent is hereby corrected as shown below:

On the Title Page

Item (30), change "1450501" to --1450501-0--.

Signed and Sealed this
Twenty-third Day of February, 2021

Drew Hirshfeld
*Performing the Functions and Duties of the
Under Secretary of Commerce for Intellectual Property and
Director of the United States Patent and Trademark Office*